United States Patent [19]

Mandelkorn

[11] Patent Number: 4,673,770
[45] Date of Patent: Jun. 16, 1987

[54] GLASS SEALED SILICON MEMBRANE SOLAR CELL

[76] Inventor: Joseph Mandelkorn, Peretz 5, Rehovot, Israel

[21] Appl. No.: 789,446

[22] Filed: Oct. 21, 1985

[51] Int. Cl.[4] ................. H01L 31/06; H01L 31/18
[52] U.S. Cl. ............................ 136/259; 136/255; 136/256; 29/572; 29/580; 29/588; 357/73
[58] Field of Search ............... 136/255, 256, 259, 251; 29/572, 580, 588–591; 156/285, 297, 299; 357/73

[56] References Cited

U.S. PATENT DOCUMENTS

| | | | |
|---|---|---|---|
| 4,283,590 | 8/1981 | Bilger et al. | 136/251 |
| 4,294,602 | 10/1981 | Horne | 65/40 |
| 4,338,481 | 7/1982 | Mandelkorn | 136/255 |
| 4,348,546 | 9/1982 | Little | 136/256 |
| 4,416,052 | 11/1983 | Stern | 29/572 |
| 4,509,248 | 4/1985 | Spitzer et al. | 29/572 |

Primary Examiner—Aaron Weisstuch

[57] ABSTRACT

An antireflection coating and a top contact pattern comprised of a thin layer of cerium covered by a layer of silver are applied to the front surface of the basic thin solar cell structure of U.S. Pat. No. 4,338,481. The contact pattern contains platforms for bonding to similar metallized platforms formed on the underside of a top cover glass. The top cover glass also comprises underside peripheral metallization for bonding to a similar bottom cover glass. After bonding of the top cover glass to the solar cell by laser welding or thermocompression bonding, the epitaxial layer at the back of the cell is thinned to a thickness of about 2 microns. The rear surface of the solar cell is then antireflectively coated, contacted, and bonded to a similarly prepared bottom cover glass, the top and bottom cover glasses being bonded and sealed at their peripheries. The bottom cover glass may also be ground and silvered so as to form a diffusive back side reflector.

16 Claims, 5 Drawing Figures

GLASS SEALED SILICON MEMBRANE SOLAR CELL

BACKGROUND

The survivability and reliability of a silicon cell depends primarily upon the nature and composition of its contacts and the means used to protect the cell from environmental degradation. Survivability of space cells, which are subject to high energy particle radiation damage, may be increased by use of silicon base material which is free of detrimental imperfections and impurities, i.e. high resistivity "P" type zero dislocation density, float-zone silicon. Extended life-time of space cells is achievable if the cells can be subjected to very high temperature short-time radiation damage annealing cycles without the cell contacts, the junction, the antireflection coating, or the cover-glass to cell bond degrading during such cycles.

Conventional cells have contacts consisting of a very thin layer of titanium, covered by a very thin layer of palladium, topped by a comparatively thick layer of silver. Organic adhesives are used to bond protective cover-glasses to the cell front surface.

The conventional cell-glass structure is susceptible to degradations from reactions of the cell contacts and the cell surfaces with environmental contaminants. Such reactions are accelerated by high operating temperatures or any high temperature treatment, such as a radiation damage anneal. The conventional contact is additionally susceptible to high temperature degradation because of the presence of titanium and the presence of undesirable impurities in the contact metals. At high temperatures, these detrimental impurities diffuse into the cell surface and degrade the cell material and the cell junction.

Another source of degradation is the adhesive used to bond the cover-glass to the cell. Presently used adhesives are susceptible to degradation from ultraviolet light and from heat.

High survivability is provided in this invention by complete glass-sealing, without the use of adhesives, and by the use of high temperature silver-cerium contacts; these contacts can be sintered at a temperature of 800° C. on 0.15 $\mu$m junction depth cells without damage to the cells. Furthermore, this invention provides a cell having a high purity, high perfection, very thin, single crystal silicon wafer base; optical reflection; and high density base carrier-accumulation. The optical reflection and base carrier-accumulation provide exceptionally high open circuit voltages and currents for extremely thin, membrane cells.

The bottom glass-cover is ground and silvered to provide a mirror which reflects the light transmitted through the very thin cell. Conventionally, reflection has been achieved by making a reflective metal back contact over the entire back of thin cells. The method of this invention avoids the decrease in back contact adherence and the completely metal-covered back surface which fabrication of conventional reflecting back contacts necessitates. This invention provides both reflection and freedom to use narrow back contact lines and to fabricate the back contact so as to provide maximum adherence. Furthermore, this invention provides more effective reflection than does a back contact reflector because the glass surface is both ground and silvered, thereby reflecting diffused light. This effectively increases the path length in the cell of the reflected photons, resulting in increased carrier generation and higher currents than achievable with back contact reflectors.

The glass mirror also reflects solar photons whose energies are too low to generate carriers; these exit through the top cover-glass. A conventional cell mounted on a support substrate will absorb the low energy photons in its back contact and in its substrate. This raises the operating temperature of the cell. This invention provides for removal of the low energy photons so that the cell operates at a lower temperature than do conventional mounted cells. Thus, in this invention, it is not required that the top cover-glass be bonded to the top contact fingers, as described in U.S. Pat. No. 3,541,679, in order to lower the operating temperature. This invention thus provides an important simplification with respect to that described in U.S. Pat. No. 3,541,679.

In some applications, it may be desirable to use large area metallized cover-glasses for mounting and interconnecting an entire solar cell module (numerous cells bonded to a glass superstrate and interconnected by metallization patterns on the superstrate and on a bottom glass substrate). The entire module may be sealed between the top glass superstrate and the bottom glass substrate by the means provided in this invention.

Whether a single glass-sealed cell or an entire glass-sealed module is concerned, the option is available to either make a glass mirror at the back of each cell or simply not to silver the glass, thereby permitting lower energy photons to exit through the bottom glass substrate, reducing the operating temperature considerably. When the mirror option is selected, best results are obtained by applying a tailored-to-the-reflected-light spectrum antireflection-coating to the back surface of the cell. The non-mirror option is preferable for thicker cells where the photons transmitted through the cell bulk are primarily too low in energy to generate carriers and there is, therefore, little cell current to be gained by reflection of the transmitted light back into the cell.

This invention is most advantageous for providing silicon solar cells having a total thickness of less than 50 microns. No solar cells can be made in this thickness range from single crystal wafers by conventional methods. There are extremely important performance advantages provided by cells having thicknesses less than 50 microns. The most important of these is that higher efficiencies are preserved in such thinner cells after high energy particle bombardment than in thicker cells having identical structures, and made from the same silicon high perfection material. Another performance advantage is that higher open-circuit voltages and much lower open-circuit voltage temperature coefficients are obtained for thinner cells made with the structure described in this invention. This advantage is extremely significant for operation under highly concentrated sunlight.

A major factor in the mechanism of power generation of the high resistivity very thin cell having minority carrier barriers at both the front and back of the base region, described in U.S. Pat. No. 4,338,481 (which patent is incorporated herein by reference for all purposes), is the value of the density of photon-generated carriers accumulated within the base region. Since the vast majority of carriers are generated by solar photons absorbed within 25 microns of the illuminated cell front surface, the density of accumulated carriers is vastly increased when the cell thickness is reduced to 25 microns or less. The high minority carrier lifetime, extremely thin base provided in this invention accumulates the photon-generated holes and electrons; this gives rise to voltages at both the front N+P junction and the back P+P junction, which are series aiding.

Increased values of cell open-circuit voltage are obtained due to the high density base carrier-accumulation provided in the cell of this invention. The density of base (bulk) accumulated carriers can be further increased by increasing solar intensity and by use of a back reflecting mirror. Under concentrated sunlight, a much greater increase in open circuit voltage occurs for the membrane cell than for thicker cells, and much lower open-circuit voltage temperature coefficients are correspondingly realized. Almost ideal high concentration operation is thus provided by this invention.

This invention provides a highly versatile cell package. The versatility is due to the wide choice provided of base material resistivity and thickness, the option of a back glass mirror, the option of either complete glass sealing or a supporting glass superstrate only, the provision of very high temperature contacts, and the metal to metal bonding of glass to cell and top cover-glass to bottom cover-glass. Options to anneal radiation damage and for additional high temperature processing are provided and the mechanisms of power generation provide increased efficiency and reliability for both 1 sun and concentrated sunlight operation.

It is, therefore, an object of this invention to provide a very thin (total thickness as little as about 15 microns), high perfection, single crystal wafer base, silicon solar cell which has high efficiency, high reliability, and high survivability for both 1 sun and concentrated sunlight applications. It is a further objective of this invention to provide a cell completely sealed in glass in a vacuum or in an inert gas environnent, without the use of adhesives. Another objective of this invention is to provide a glass-sealed cell which can be heated to temperatures up to about 800° C. in any atmosphere without suffering significant degradation of performance or reliability.

It is another objective of this invention to provide a thin glass-sealed cell which has high efficiency and increased survivability under conditions of high temperature operation.

Another objective of this invention is to provide a glass-sealed cell which can be heated to temperatures up to 800° C. without significant degradation of performance or reliability in order to anneal radiation damage.

An additional objective of this invention is to provide a glass-sealed silicon solar cell which can be subjected to further very high temperature processing in a reactive gas environnrent, e.g. as required to fabricate a tandem amorphous silicon cell on the top glass surface of the sealed-in-glass single crystal silicon membrane cell.

It is another objective of this invention to provide an extremely thin, sealed-in-glass, silicon solar cell whose current is increased by grinding and silvering the glass at the back of the cell, so as to reflect light transmitted through the cell backwards into the cell.

It is an objective of this invention to provide a method for fabricating a cell as thin as about 15 microns having a single crystal wafer base and a rugged top cover-glass support.

It is a further objective of this invention to provide a method for completely sealing a silicon solar cell in a glass enclosure by bonding metallized regions on the cell surfaces to matching metallized regions on a top and a bottom cover-glass and bonding the cover-glasses to each other along metallized peripheral regions.

Finally, it is an objective of this invention to provide a method for fabricating an extremely thin, single crystal wafer base, glass-sealed, silicon solar cell which has much higher resistance to degradation from high temperatures, ultraviolet radiation, high energy particle irradiation, and environmental factors than conventional cells.

SUMMARY OF THE INVENTION

A sealed-in-glass, extremely thin, high efficiency, single crystal wafer base, silicon solar cell is provided as well as a method for making such a cell.

Fine-line silver-cerium contacts having bonding platforms are applied to the top of the basic cell structure described in U.S. Pat. No. 4,338,481 and sintered at a temperature above 600° C., to yield strong adherence.

An antireflection coating is applied to the top surface of the cell. A top cover-glass is metallized with layers of cerium and silver in a pattern providing matching platforms for bonding to the contact platforms on the cell top surface and peripheral metallized regions for subsequent bonding to matching metallized peripheral regions of a bottom cover-glass. The top cover-glass is bonded to the cell top contact platforms by laser welding or thermocompression bonding. Henceforth, the top cover-glass serves as a high temperature rugged support for the silicon cell structure.

The epitaxial layer at the back of the cell is now reduced in thickness to a thickness of about 2 microns. Fine-line silver cerium contacts having bonding platforms are then applied to the back surface of the cell and the resultant extremely thin silicon membrane cell, supported by its top cover-glass, is sintered at a temperature above 600° C. to obtain strong contact adherence. An antireflection coating is applied to the back of the cell.

A bottom cover-glass is metallized with silver-cerium layers in a pattern providing matching platforms for bonding to the back contact platforms of the suspended silicon membrane cell and peripheral regions for bonding to the metallized periphery of the top cover-glass. The central region of the bottom cover-glass, facing the active area of the cell, is previously ground and silvered to act as a diffusing mirror, if this option is selected.

The bottom cover-glass is inserted into a holding jig, the silicon membrane cell suspended from the top cover-glass is placed on top of the bottom cover-glass, and thin silver mesh strips are inserted between the metallized peripheral regions of the top and bottom cover-glasses. The elements of this package are then bonded at matching silver-cerium metallized regions by laser welding or thermocompression bonding in vacuum or in an inert gas atmosphere.

The method of this invention provides an extremely thin (thickness as little as about 15 microns), single crystal wafer base, silicon solar cell which has extraordinary high open circuit voltage and short circuit current and is completely sealed in a glass enclosure. The cell has higher efficiency, reliability and survivability than conventional glass-covered cells.

DETAILED DESCRIPTION

This invention comprises a high efficiency, high reliability, high survivability, sealed-in-glass, very thin single crystal wafer base, silicon solar cell, as well as a method for making such a cell.

The key factors of this invention are:

1. Use of the basic cell structure of the very thin, silicon wafer base, solar cell described in U.S. Pat. No. 4,338,481.
2. The method of bonding the basic structure to a supporting top cover-glass by means of matching metallized bonding platforms so that the back epitaxial layer can then be thinned, resulting in a silicon membrane cell as thin as about 15 microns.
3. The means and method of metallization which permit the subsequent very high temperature processing necessary for sintering the back contact applied to the thinned, glass supported, silicon membrane and for subsequently sealing the cell in a glass enclosure by welding or thermocompression bonding of metallized regions.

Figure 1:
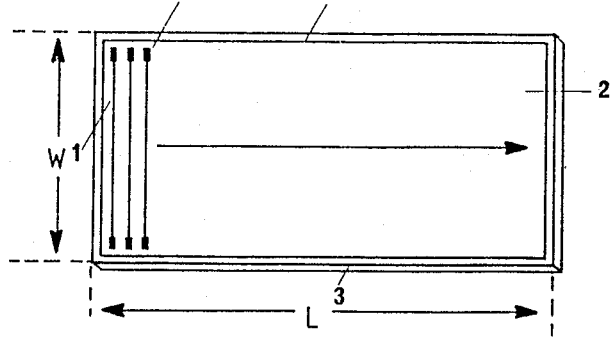
FIGS. 1 and 3 are isometric views showing the metallized front and rear surfaces, respectively, of the thin solar cell of the invention.

As shown in FIG. 1, a silver-cerium fine-line contact, 1, is applied to the top surface of the basic cell structure, 3, described in U.S. Pat. No. 4,338,481. As shown, the top junction is planar, having a 125 micron wide oxide covered border, 5. Typical line widths are 10–25 microns and the line heights have corresponding dimensions. Typical line spacing is about 500 microns. The lines terminate in contact platforms, 4, for bonding to a top cover-glass. The contact is sintered at a temperature above 600° C. in an inert atmosphere to obtain strong adherence.

An antireflection coating, consisting of a layer of magnesium fluoride above a layer of aluminum oxide, 2, is applied to the top surface, covering the line contacts but not the contact platforms.

Figure 2:
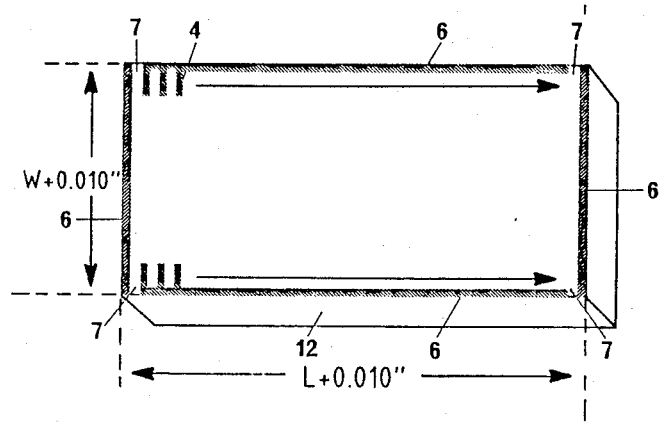
FIGS. 2 and 4 are isometric views showing the top and bottom metallized cover glasses, respectively.

As shown in FIG. 2, a top cover-glass, 12, is metallized with layers of cerium and silver and sintered at a temperature above 600° C. In the preferred embodiment, the top cover-glass is made of artificial sapphire. It is larger in size than the cell, as shown. The metallized pattern applied to the top cover-glass contains platforms, 4, for bonding to matching platforms on the cell top contact, and peripheral regions, 6, for bonding to a bottom cover-glass. Open spaces in the peripheral metallization, 7, provide for subsequent electrical isolation of the top and bottom external contacts.

The contacted and anti-reflection coated basic cell structure is placed in a holding jig, the metallized top cover-glass is placed on top of the cell, and the two are bonded together at their matching platforms, using laser welding or thermocompression bonding. The epitaxial layer at the back of the glass-supported basic structure is now reduced in thickness, to a thickness of about 2 microns, by means of precision lapping and/or chemical etching. The final epitaxial layer thickness is not critical.

Figure 3:
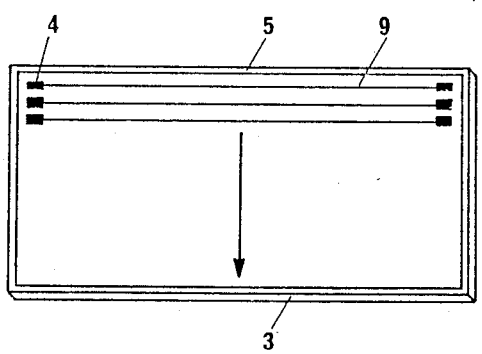

As shown in FIG. 3, a silver-cerium fine-line contact, 9, with bonding platforms, 4, is applied to the back of the glass-supported silicon membrane cell and the glass-supported cell is heated to above 600° C. to sinter the contact. Using suitable masking, a 125 micron wide border, 5, is etched down to the base region. An aluminum oxide antireflection coating is then applied, covering the entire back of the cell except the bonding platforms.

Figure 4:
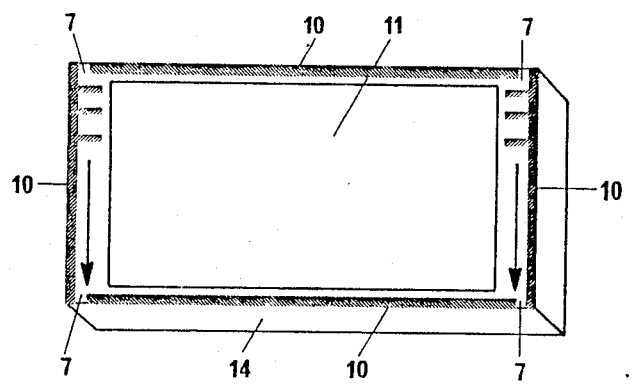

As shown in FIG. 4, a bottom, artificial sapphire, cover-glass, 14, is metallized with layers of cerium and silver and sintered at a temperature above 600° C. The metallized pattern contains bonding platforms for bonding to the cell back contact platforms and peripheral regions, 10, for bonding to the metallized peripheral regions of the top cover-glass. Open spaces, 7, in the peripheral metallization provide for electrical isolation of the top and bottom external contacts. The section of the bottom cover-glass, 11, which will face the active area of the cell, is ground and silvered to form a light diffusing mirror.

The bottom cover-glass is loaded into a holding jig, the silicon membrane cell supported by the top cover-glass is placed on the bottom cover-glass, 0.001–0.002 inch thick silver mesh strips are placed between the metallized peripheries of the cover-glasses, and glass frits are placed at the open spaces, 7, of the peripheral metallization. The assembly is then bonded at matching metallized regions by laser welding or thermocompression bonding in a vacuum or in an inert atmosphere.

Figure 5:
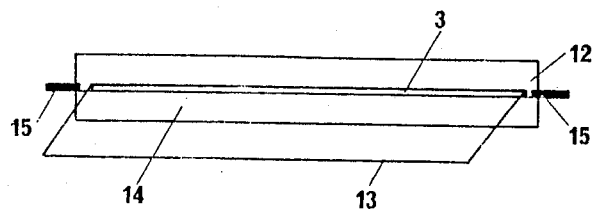
FIG. 5 is a cross-sectional view showing the completed sealed thin solar cell of the invention.

As shown in FIG. 5, the resultant package is an extremely thin silicon membrane cell, 3, sealed within top, 12, and bottom, 14, sapphire cover-glasses, and having a silver-mesh-strip external contact to the top of the cell, 13, and a silver-mesh-strip external contact to the bottom of the cell, 15.

While a preferred embodiment of the invention has been shown and described, it will be appreciated that various modifications may be made without departing from the spirit of the invention or the scope of the subjoined claims. For example, the top contact configuration described is for a cell which is to be exposed to space or terrestrial sunlight. If the cell is to be exposed to concentrated sunlight, more optimum top contact configurations, which are well known, should be utilized. For special applications, it may be desirable to fabricate the top surface planar junction as separate small area planar junctions, each "dot" junction is then interconnected to its neighbors by fine-line contacts running on the surface of the antireflection coating.

What is claimed is:

1. An improved silicon back surface field solar cell comprising a high quality very thin silicon single crystal wafer base 0.0005 to about 0.0004 inch thick, said base containing a back surface field region of the same type, P or N, as said base, said back surface field region having a thickness of about 1 $\mu$m and a dopant surface concentration of about $10^{19}$ atoms/cm$^3$, said cell having a substantially thicker epitaxial layer of silicon, doped with an impurity concentration which will provide the desired surface impurity concentration for the diffused back surface field region, interposed between the back surface filed region and the cell back contact, said interposed layer having a thickness sufficient to provide required cell ruggedness, wherein the top of said cell is bonded to a top cover-glass support by means of high temperature metallized bonding platforms on said cell and on said glass-cover, wherein said epitaxial layer at the back of said cell has a reduced thickness, being less than 25 microns thick, and wherein said thin epitaxial layer is contacted by a high temperature fine-line contact having bonding platforms.

2. The cell, as claimed in claim 1, completely sealed between said top cover-glass and a bottom cover-glass, by means of bonding high temperature metallized regions along the peripheries of said top and said bottom cover-glasses, said bottom cover-glass being bonded to said bottom contact at matching metallized platforms.

3. The cell, as claimed in claim 2, wherein said bottom cover-glass is ground and silvered to reflect light transmitted through said cell back into the cell.

4. A solar cell, as claimed in claim 1, whose base is P type and which has a top shallow diffused region consisting of a phosphorus diffused layer at the top of which is an arsenic diffused layer, the arsenic surface concentration being about ten times that of the phosphorus surface concentration.

5. A cell, as claimed in claim 1, whose base is cut from a high quality silicon ingot having a resistivity of about 1.0 ohm-cm or greater.

6. A cell, as claimed in claim 1, whose base is cut from a silicon ingot having a minority carrier lifetime of 100 microseconds or greater.

7. A method for fabrication of a silicon back surface field solar cell having a very thin silicon single crystal wafer base 0.0005 to about 0.004 inch thick, comprising the steps of (a) epitaxially depositing a layer of silicon on the back surface of a comparatively thick single crystal silicon wafer, said deposited layer being doped during deposition so as to provide a required impurity and impurity surface concentration for creation of an optimum back surface field diffused region in said wafer, said diffused region being of the same semiconductor type, P or N, as said wafer and being formed in said wafer during said deposition process, said diffused region having an impurity surface concentration of about $1 \times 10^{19}$ atoms/cm$^3$ and a depth of about 1 μm, said deposited silicon layer thickness being such as to provide the ruggedness required for the completed cell, (b) thinning the resultant wafer by removing silicon from its top surface to obtain the required base thickness for the cell, (c) creating a shallow P-N junction at the top of said wafer, and (d) applying top and back contacts and a top surface antireflection coating, wherein a high temperature contact having bonding platforms is applied to said cell top surface, a cover-glass is metallized with matching platforms, said cover-glass is bonded to said cell top surface at the matching platforms to provide a high temperature support, said epitaxial layer at the back of said cell is reduced in thickness to a thickness less than 25 microns, and a fine-line high temperature back contact having bonding platforms is applied to said thinned epitaxial layer.

8. The method as claimed in claim 7, in which said top cover-glass is also metallized along its periphery, a bottom cover-glass is metallized both along its periphery and to provide platforms matching the bonding platforms on said thinned epitaxial layer; said top and said bottom cover-glass are bonded to each other along their metallized peripheries and said cell is bonded to said bottom cover-glass at their matching platforms, simultaneously in a holding jig in vacuum or in an inert gas atmosphere.

9. The method, as claimed in claim 8, in which said bottom cover-glass is ground and silvered in the region facing the active area of the cell.

10. The method, as claimed in claim 7, wherein the silicon wafer is cut from a high quality ingot having a resistivity about 1.0 ohm cm or greater.

11. The method, as claimed in claim 7, wherein the silicon wafer is cut from a high quality ingot having a minority carrier lifetime of 100 microseconds or more.

12. The method as claimed in claim 7, wherein the shallow P-N junction at the top of the cell is made by simultaneous diffusion of arsenic and phosphorus with conditions such that the arsenic surface concentration is about ten times that of the phosphorus surface concentration.

13. A method for fabrication of an improved, back surface field, very thin base, cell in which a wafer is cut from a P type, float-zone, zero dislocation density, silicon ingot having a resitivity of 1.0 ohm cm or greater, said wafer being thick in comparison to the thickness desired for the base, growing an epitaxial layer on one surface, the back, of said wafer, said epitaxial layer being doped, during its growth, with boron to a concentration of about $1 \times 10^{19}$ atoms/cm$^3$, a boron diffused layer having a thickness of aboout 1.0 micrometer being formed in said wafer during the growth of said epitaxial layer, thinning said wafer to the thickness desired for the base by removing silicon from the surface opposite the epitaxial layer, the front surface, diffusing an N type impurity or impurities to form a shallow N+,P junction below the front surface, applying contacts to the top and bottom of the structure so formed, and applying an antireflection coating to the top surface, wherein a high temperature contact having bonding platforms is applied to said cell top surface, a cover-glass is metallized with matching platforms, said cover-glass is bonded to said cell top surface at the matching platforms to provide a high temperature support, said epitaxial layer at the back of said cell is reduced in thickness to a thickness less than 25 microns, and a fine-line high temperature back contact having bonding platforms is applied to said thinned epitaxial layer.

14. The method, as claimed in claim 13, in which the shallow N+, P junction is formed by simultaneous diffusion of arsenic and phosphorus into the front surface, the depth of phosphorus diffusion being about 0.5 micrometers and the corresponding depth of arsenic diffusion being about 0.2 micrometers, the phosphorus surface concentration being limited to about $1 \times 10^{19}$ atoms/cm$^3$ and the arsenic surface concentration being about $1 \times 10^{20}$ atoms/cm$^3$.

15. The method as claimed in claim 13, in which said top cover-glass is also metallized along its periphery, bottom cover-glass is metallized both along its periphery and to provide platforms matching the bonding platforms on said thinned epitaxial layer; said top and said bottom cover-glass are bonded to each other along their metallized peripheries and said cell is bonded to said bottom cover-glass at their matching platforms, simultaneously in a holding jig in vacuum or in an inert gas atmosphere.

16. The method, as claimed in claim 15, in which said bottom cover-glass is ground and silvered in the region facing the active area of the cell.

* * * * *